United States Patent
Ardenkjaer-Larsen et al.

(10) Patent No.: US 6,453,188 B1
(45) Date of Patent: Sep. 17, 2002

(54) METHOD OF MAGNETIC RESONANCE IMAGING

(75) Inventors: Jan Henrik Ardenkjaer-Larsen; Oskar Axelsson; Klaes Golman; Georg Hansson, all of Malmo (SE); Ib Leunbach, Dragör (DK); Stefan Petersson; Lars-Goran Wistrand, both of Malmo (SE)

(73) Assignee: Amersham Health AS, Oslo (NO)

(*) Notice: Subject to any disclaimer, the term of this patent is extended or adjusted under 35 U.S.C. 154(b) by 0 days.

(21) Appl. No.: 09/333,910

(22) Filed: Jun. 16, 1999

Related U.S. Application Data

(63) Continuation of application No. PCT/GB98/00021, filed on Jan. 5, 1998.
(60) Provisional application No. 60/066,573, filed on Nov. 26, 1997.

(30) Foreign Application Priority Data

| Jan. 8, 1997 | (GB) | ............................................... 9700256 |
| Nov. 20, 1997 | (GB) | ............................................... 9724590 |
| Nov. 28, 1997 | (GB) | ............................................... 9725364 |

(51) Int. Cl.$^7$ ................................................. A61B 5/05
(52) U.S. Cl. ....................... 600/420; 424/9.3; 324/307; 324/309
(58) Field of Search ................................ 600/420, 410; 324/307, 309; 424/9.3

(56) References Cited

U.S. PATENT DOCUMENTS

| 5,617,859 A | * | 4/1997 | Souza et al. ................. 600/420 |
| 5,785,953 A | * | 7/1998 | Albert et al. ................. 424/9.3 |
| H1968 H | * | 6/2001 | Bernstein .................... 600/410 |
| 6,278,893 B1 | * | 8/2001 | Ardenkjaer-Larson et al. ... 600/420 |

FOREIGN PATENT DOCUMENTS

| WO | WO 95 27438 | 10/1995 |
| WO | WO 95/27438 | 10/1995 |

OTHER PUBLICATIONS

XP 002034982, MR Imaging with Hyperpolarized $^3$He Gas, Hunter Middleton, Robert D. Black, Brian Saam, Gordon D. Cates, Gary P. Cofer, Robert Guenther, William Happer, Lawrence W. Hedlund, G. Alan Johnson, Kim Juvan, John Swartz, MRM 33:271–275 (1995).

XP 000304183, The Use of Dynamically Polarized Contrast Agents, 2244 Research Disclosure (1993) Apr., No. 348, Emsworth, GB.

"The use of dynamically polarized contrast agents", Research Disclosure, No. 348, 1993, p. XP000304183, see whole document.

H. Middleton et al., "Mr. Imaging with Hyperpolarized 3He Gas", Magnetic Resonance In Medicine, vol. 33, 1995, pp. 271–275, XP002034982, see whole document.

* cited by examiner

Primary Examiner—Brian L. Casler
(74) Attorney, Agent, or Firm—Bacon & Thomas

(57) ABSTRACT

The invention relates to a method of magnetic imaging (MR) of a living sample comprising the steps of hyperpolarizing a hyperpolarizable gas ex-vivo and transferring the nuclear polarization from the hyperpolarized gas to the nuclei of an MR imaging agent, that is not hyperpolarizable, that is exposed to a uniform magnetic field and that is introduced in contact to the hyperpolarizable gas, separating the hyperpolarizable gas from the MR imaging agent, administering the MR imaging agent to the living sample, exciting NMR transitions in the nuclei of the imaging agent and detecting an NMR signal thereof.

12 Claims, 5 Drawing Sheets

HYDROGEN

HELIUM

METHOD OF MAGNETIC RESONANCE IMAGING

This application is a continuation of pending international application number PCT/GB98/00021 filed Jan. 5, 1998 (of which the entire disclosure of the pending, prior application is hereby incorporated by reference), which itself is a continuation-in-part of U.S. provisional application No. 60/066,573 filed Nov. 26, 1997; benefit of which is claimed under 35 U.S.C. 119(e).

This invention relates to a method of dynamic nuclear polarisation (Overhauser) enhanced magnetic resonance imaging (OMRI).

Magnetic resonance imaging (MRI) is a diagnostic technique that has become particularly attractive to physicians as it is non-invasive and does not involve exposing the patient under study to potentially harmful radiation such as X-rays.

Conventional Overhauser enhanced MRI has been primarily reported in the context of electron spin resonance enhanced magnetic resonance imaging (ESREMRI, PEDRI or OMRI). This is a method of MRI in which enhancement of the magnetic resonance signals (often by a factor of a hundred or more) from which images may be generated is achieved by virtue of dynamic nuclear polarization (the Overhauser effect) that occurs on VHF stimulation of an ESR transition in a material in the subject under study.

In the basic in vivo OMRI technique, dynamic nuclear polarization results in an increase in the population difference between the excited and ground nuclear spin states of selected nuclei, generally protons, which are responsible for the magnetic resonance signals. Since MR signal intensity is proportional to this population difference, the subsequent stages of each imaging sequence, performed essentially as in conventional MRI techniques, result in larger amplitude MR signals being detected.

OMRI enhancement agents (frequently simply referred to as contrast agents) which exhibit an ESR transition able to couple with an NMR transition of the MR imaging nuclei may be naturally present within the subject (eg. oxygen or melanin) or may be administered thereto. OMRI enhancement agents have been reported in inter alia WO-A-88/10419 (Hafslund Nycomed Innovation AB), WO-A-90/00904 (Hafslund Nycomed Innovation AB), WO-A-91/12024 (Nycomed Innovation AB) and WO-A-93/02711 (Hafslund Nycomed Innovation AB). Most of the OMRI enhancement agents disclosed to date are radicals (eg. organic free radicals) and their use in vivo is constrained by their inherent instability and toxicity. It will often be the case that a radical found to give excellent ESR enhancement factors in vitro cannot be used diagnostically due to its physiological incompatibility. There is therefore a need for improved methods of OMRI which are more flexible, i.e. less constrained by physiological factors.

U.S. Pat. No. 5,545,396 (Albert) discloses an in vivo MR imaging method in which a noble gas (eg. $^{129}$Xe or $^3$He) having a hyperpolarised nuclear spin is inhaled into the lungs and a representation of its spatial distribution therein is generated. MR imaging of the human oral cavity using hyperpolarised $^{129}$Xe was also reported by Albert in J. Mag. Res., 1996: B111, 204–207. Naturally the technique disclosed by Albert is unsuitable for administration routes other than inhalation and is therefore of limited utility in MR imaging. Its use is also subject to the physiological problems associated with in vivo administration of a noble gas.

Research Disclosure No. 348, 1993, page 242 discloses an Overhauser enhanced MRI imaging technique wherein the electron paramagnetic resonance of a free radical is irradiated under the right conditions so as to enhance the NMR signal.

The present invention is based on a method of MRI of a sample in which it is possible to avoid administering the whole of, or substantially the whole of, an OMRI enhancement agent to the sample, whilst still achieving a desired Overhauser enhanced contrast effect. The method relies on ex vivo dynamic nuclear polarisation of selected nuclei of an MR imaging agent by a hyperpolarised gas, the latter conveniently being separated from the MR imaging agent prior to administration of the polarised MR imaging agent into the sample (eg. the subject).

Figure 1:
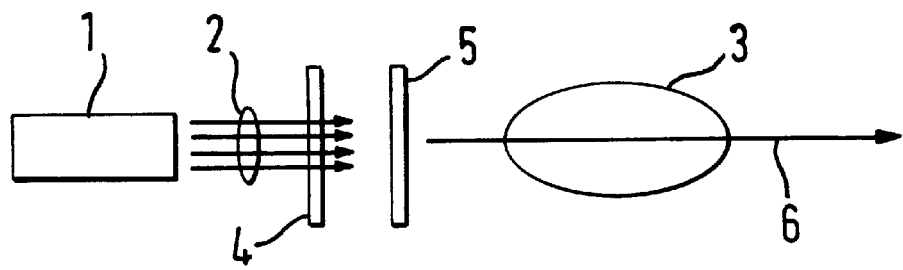
FIG. 1 is a schematic diagram of an optical apparatus suitable for directly pumping helium.

Thus viewed from one aspect the present invention provides a method of magnetic resonance investigation of a sample, preferably of a human or non-human animal body (eg. a mammalian, reptilian or avian body), said method comprising:

(i) hyperpolarising a hyperpolarisable gas before, during or after introducing an MR imaging agent thereto whereby to cause nuclear polarization of said MR imaging agent;

(ii) optionally (simultaneously or sequentially to step (i)) exposing the MR imaging agent to a uniform magnetic field (eg. the primary field $B_0$ of the imaging apparatus or a weaker field, eg. of $1 \times 10^{-4}$ Tesla (1 gauss) or more);

(iii) separating the whole, substantially the whole, or a portion of said hyperpolarisable gas from said MR imaging agent;

(iv) administering said MR imaging agent to said sample;

(v) exposing said sample to radiation of a frequency selected to excite nuclear spin transitions in the MR imaging nuclei in said MR imaging agent;

(vi) detecting magnetic resonance signals from said MR imaging agent in said sample; and (vii) optionally, generating an image or biological functional data or dynamic flow data from said detected signals.

By hyperpolarisable gas is meant a gas with a nonzero spin angular momentum capable of undergoing an electron transition to an excited electron state and thereafter of decaying back to the ground state. Depending on the transition that is optically pumped and the helicity of the light a positive or negative spin hyperpolarisation may be achieved (up to 100%). Examples of gases suitable for use in the method of the invention include the noble gases He (eg. $^3$He or $^4$He), Ne, Ar, Kr and Xe (eg. $^{129}$Xe), preferably He, Ne or Xe, especially preferably He, particularly $^3$He. Alkali metal vapours may also be used eg. Na, K, Rb, Cs vapours. Mixtures of the gases may also be used. In one embodiment of the method of the invention, the hyperolarisable gas may be used in liquid form. The term hyperpolarisable gas also covers any gas with non-zero nuclear spin, preferably a gas which may be polarised by optical pumping, preferably $^{129}$Xe or $^3$He.

By MR imaging agent is meant an agent containing nuclei (MR imaging nuclei) capable of emitting magnetic resonance signals. Generally such nuclei will be protons, preferably water protons; however other non-zero nuclear spin nuclei may be useful (eg. $^{19}$F, $^{3}$Li, $^{1}$H, $^{13}$C, $^{15}$N or $^{31}$P but preferably $^{13}$C nuclei) and in this event the MR signals from which the image is generated will be substantially only from the MR imaging agent.

Thus the invention involves the sequential steps of hyperpolarisation of a hyperpolarisable gas, dynamic nuclear polarisation of MR imaging nuclei ex vivo, administration of polarised MR imaging nuclei, and conventional in vivo MR signal generation and measurement. The MR signals obtained in this way may be conveniently converted into 2-, 3- or multi-dimensional image data or into flow data. The method according to the invention has a number of advantages over known in vivo methods of MRI, some of which are referred to below.

One advantage is that substantially the whole of the hyperpolarisable gas is removed from the administrable medium prior to administration. Thus whereas the diagnostic utility of OMRI enhancement agents or administered hyperpolarised noble gases is subject to the constraints imposed by the physical and chemical characteristics of the administrable media in which the enhancement agent/noble gas is formulated (for example the deleterious effect the agent may have on viscosity, pH, etc. of the formulation) and by the characteristics of the enhancement agent/noble gas itself (eg. toxicity, stability, biodegradability and biodistribution), the present method is substantially free from such constraints.

In any conventional OMRI experiment carried out in vivo, there will be a number of secondary factors acting to relax the excited spin state back to equilibrium and reduce the amplitude of the MR signal obtained. In particular, MR imaging agents will be subject to local magnetic field inhomogeneities resulting, for example, from the presence of paramagnetic species such as iron (eg. in erythrocytes), or dissolved oxygen in the body fluid or of the radical itself responsible for Overhauser enhancement (i.e. radical self-broadening), all of which serve to increase the rate of relaxation. The relaxation rate will also be dependent on the temperature and chemical nature of the body fluid. The present method however alleviates these problems by providing polarisation ex vivo. This is possible since the method allows the chemical environment, pH and temperature to be optimised by the operator.

Naturally for in vivo imaging, the MR imaging agent used in the present method should have nuclei (eg protons) capable of emitting magnetic resonance signals. Whilst the MR imaging agent may be solid, liquid or gas, it should of course be physiologically tolerable or be capable of being provided in a physiologically tolerable form. Besides protons other MR imaging nuclei may of course be used, eg $^{14}$F, $^{13}$C, $^{31}$P and sodium and of these $^{13}$C is preferred. Preferred MR imaging agents according to the invention exhibit the properties of inter alia high stability to oxygen, to pH (eg in the pH range 5–9), to physiological temperatures and are stable in body fluids. They are of course non-toxic and preferably are rapidly excreted.

It will be appreciated that in the present method the hyperpolarised gas may transfer polarisation to the nuclear spin system of an MR imaging agent directly or indirectly. Where the MR imaging agent is to be polarised indirectly by water vapour, it may be advantageously water soluble. Similarly solid MR imaging agents are preferably water soluble to assist in formulating administrable media.

Conveniently, the MR imaging agent once polarised will remain so for a period sufficiently long to allow the imaging procedure to be carried out in a comfortable time span. Preferably, significant polarisation will be retained by the MR imaging agent in its administrable form for at least 1 s, preferably at least 60 s, more preferably at least 100 s and especially preferably 1000 s or longer. Solid MR imaging agents (e.g. $^{13}$C enriched solids) have $T_1$ of several hours in the bulk phase, although this may be reduced by reduction of grain size. This is particularly advantageous in allowing the polarised MR imaging to be stored prior to formulation and administration.

Whilst the MR imaging agent may be in gaseous, liquid or solid form, it is preferred for the MR imaging agent to be in a gaseous form at the time of polarization transfer. One particularly preferred gaseous MR imaging agent is water vapour which is conveniently mixed with a hyperpolarisable gas (eg. $^{129}$Xe, $^{3}$He or $^{4}$He) at an elevated temperature to maintain the vapour. Generally speaking, the more dense the gaseous mixture in this particular embodiment, the more rapid is the polarisation transfer to the water vapour so that it is desirable to have the gas mixture under a pressure typically above 300000 Pascal (3 atmospheres), preferably above 3000000 Pascal (30 atmospheres) or even more preferably above 30000000 Pascal (300 atmospheres). Indirect polarisation transfer may be achieved via an intermediate gas medium, for example water vapour. Where the intermediate gas medium is water vapour, it may be advantageously converted into liquid water whilst still polarised and used as the administration medium for the MR imaging agent to which it transfers the polarisation (eg. the MR imaging agent may be one which dissolves rapidly in water and has a long $T_1$ relaxation time).

Where the MR imaging agent is polarised whilst in a gaseous state, it is convenient (for the purposes of separation from the hyperpolarised gas and of administration) to be able to rapidly convert it into a liquid or solid. Thus where water vapour is used as the MR imaging agent rapid quenching is desirable to condense out polarised water. Thus removing the elevated pressure and temperature imposed on the gas mixture will lead to rapid cooling and condensation of polarised water. Further rapid cooling is possible by adding, for example, cold saturated salt solutions (eg. Ringers Solution at −15° C.) or other cooling agents which conveniently serve to provide a medium in which the polarised MR imaging agent may be administered. Yet further cooling is possible by, for example, contacting the polarised MR imaging agent with a cold surface prior to administration. Administration should occur in a fraction of the relaxation time $T_1$ of the polarised MR imaging agent and should typically be within 3s of the temperature/pressure drop.

Using water vapour in accordance with one embodiment of the present invention leads to surprisingly high polarisation of the water protons, equivalent to exposure to a field of $10^3$ Tesla (1% of theoretical maximum polarisation). Moreover the effect remains for a number of seconds, typically 30–40 s depending on the circumstances. Water vapour may be added to the hyperpolarisable gas prior to hyperpolarisation or may be created in situ by heating a water/hyperpolarisable gas mixture in a suitable chamber. In the latter case, the inert nature of noble gases is a particular advantage. The volume of water vapour used is generally 5 liters or more, preferably 10 liters or more, particularly preferably 15 liters or more and especially preferably 24 liters or more. In practice, the concentration of noble gas required is relatively low, for example a few hundred Pascal (few Torr). If the gas has only nuclear magnetism the pressure should be more than 300000 Pascal (3 atmospheres), preferably 3000000 Pascal (30 atmospheres) or more and more preferably 30000000 Pascal (300 atmospheres) or more.

A further advantage of the present method over prior art MR methods involving hyperpolarised noble gas administration is that the polarised MR imaging agent may be administered (either alone or with additional components) in liquid form. In addition to making available other administration routes, the retention of polarisation in a liquid medium vis-a-vis a gas medium is significantly greater. Thus while $T_1$ and $T_2$ are in general shorter for the liquid, the $T_2$* effect due to diffusion is $10^5$ times less significant for the liquid.

Consequently for gaseous MR imaging agents the imaging sequence used generally has to be FLASH or GRASS while in contrast, more efficient imaging sequences may be used in the present technique. For example, liquids generally have slower diffusion which makes it possible to use sequences such as echo planar imaging (EPI). The overall technique will be faster and yield better resolution (voxel size <1 mm) than conventional techniques (voxel size approx. 1–5 mm) at current acquisition times. It will give good images at all fields including in low field (eg. 0.01–0.5 T) machines.

In a further preferred embodiment of the method according to the invention, a hyperpolarised gas (eg. $^3$He) at elevated pressure is passed through a column of solid $^{13}$C enriched MR imaging agent until steady state polarisation of the solid is achieved. In general, it is possible for the solid MR imaging agent to attain the same degree of polarisation as the polarised gas and solids typically have $T_1$ relaxation times of several hours.

After equilibration, the polarised solid MR imaging agent may be dissolved in administratable media (eg. water), administered to a subject and conventional $^{13}$C MR imaging performed. One advantage of this particular embodiment is the long relaxation time $T_1$ of $^{13}$C enriched solids in solution; typically this will be several minutes. This allows the experiment (i.e. administration through to imaging) to be conveniently carried out with less haste. Preferred MR imaging agents for use in this embodiment have a $T_1$ relaxation time in their adminstratable form of at least 1 s, preferably at least 60 s, more preferably at least 100 s and especially preferably 1000 s or more. For this purpose, MR imaging agents containing $^{13}$C enriched carbonyls or quaternary carbons are preferred. MR imaging agents having long $T_1$ and/or $T_2$ values in solution are also advantageous for image generation.

Solid $^{13}$C enriched MR imaging agents useful in this particular embodiment are preferably water soluble eg. $^{13}$C enriched carbonates, bicarbonate or acetates. $^{13}$C enriched amino acids and known contrast agents are also preferred. Intermediates in normal metabolic cycles such as the citric acid cycle eg. fumaric acid and pyruvic acid are preferred for the imaging of metabolic activity. $^{13}$C enriched MR imaging agents also have the advantage that they exhibit large changes in chemical shift parameters in response to physiological changes eg. pH or temperature.

Viewed from a further aspect the invention provides a physiologically tolerable MR imaging agent composition comprising a polarised $^{13}$C enriched MR imaging agent together with one or more physiologically tolerable carriers or excipients. Preferably the polarised MR imaging agent has an effective $^{13}$C nuclear polarisation of 0.1 T or more, more preferably 25 T or more, particularly preferably 100 T or more, especially preferably 500 T or more. Preferably the composition is sterile and is stable at a physiologically tolerable temperature (eg. at 10–40° C.).

However the invention is not limited to the use of $^{13}$C enriched solids as MR imaging agents and in a further embodiment polarised $^{13}$C enriched gases may be used. In this embodiment the gaseous MR imaging agents are conveniently administered by inhalation and may be for example known carbon-containing pharmaceutical aerosols. Examples of suitable $^{13}$C containing gases are inter alia $CO_2$, CO, $C_nX_{4n}$ (wherein: $n \geq 1$ and each X=H, F, Cl, Br) including $CF_4$, $C_3F_{12}$, $CHClF_2$, $CCl_2F_2$ and $CCl_3F$, and $C_2H_4F_2$, $C_4H_{10}$, $C_2H_2F_4$, $C_3H_8$, $C_4H_{10}$, $C_2H_3ClF_2$, $C_2Cl_2F_4$, fluorodeoxyglucose, $C_2H_6O$, $C_nX_{3n}CY$ (wherein: $n \geq 2$; each X=H, F, Cl, Br; and Y=oxygen or sulphur) including acetone and its sulphur analogue.

Whilst it is not essential for the polarised gaseous MR imaging agent to have undergone polarisation in the gaseous state, it is generally preferred that this is the case. During the polarisation and separation steps, the MR imaging agent may for example be a volatile liquid which is readily convertible into a gas for inhalation. It may be convenient to administer the gaseous MR imaging agent together with a portion of (or the whole of) a hyperpolarised gas and optionally in the presence of other gases.

Where the $^{13}$C enriched gaseous MR imaging agent is carbon monoxide, precautions will need to be taken given the toxicity of the gas. Typically CO will be administered in low doses or as a bolus to image both the lungs and the vasculature and preferably in the presence of the hyperolarised gas (eg noble gas). The MR imaging agent will be substantially free of oxygen and the lungs may be conveniently flushed of oxygen prior to inhalation of the CO containing MR imaging agent composition and reoxygenated shortly thereafter. Where the $^{13}$CO is administered together with hyperpolarisable gas, it will be advantageous to perform a dual imaging procedure such that the CO is imaged by $^{13}$C MR and the noble gas by an appropriate imaging procedure. This may preferably be carried out using real time imaging (eg EPI or gradient echo) with a view to obtaining difference images which reveal abnormalities at the lung surface and the vasculature.

Viewed from a further aspect the invention provides an inhalable composition comprising a polarised $^{13}$C enriched gas together with one or more physiologically acceptable inhalants.

$^{13}$C enriched MR imaging agents have $^{13}$C at one particular position (or more than one particular position) in an amount in excess of the natural abundance ie. above about 1%. Preferably such a single carbon position will have 5% or more $^{13}$C, particularly preferably 10% or more, especially preferably 25% or more, more especially preferably 50% or more, even more preferably in excess of 99% (e.g. 99.9%).

Figure 3:
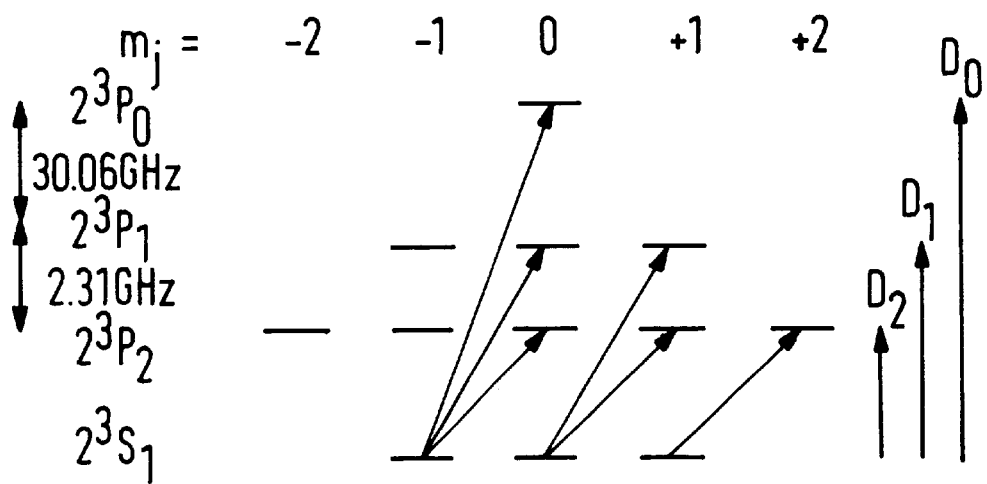
FIG. 3 shows the triplet state for helium ($^4$He) split three states indicating the relative orientation of the total electron spin with respect to the quantisation axis.
Figure 4:
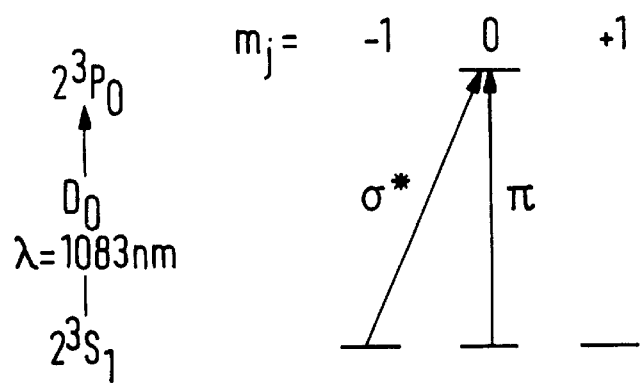
FIG. 4 shows nearly 100% polarization by the accommodation of two laser beams of different polarizations and propagation.

In order to generate a hyperpolarised gas, the gas is first subjected to a discharge or other means of excitation (eg. an appropriate radiofrequency) which creates a metastable unpaired electron spin state and is then optically (eg. laser) pumped at an appropriate frequency to create electron hyperpolarisation. The various methods for achieving this are well known to those skilled in the art. Thus, for example, for helium ($^4$He), the triplet state ($2^3S_1$) may be created from a weak electrical discharge of 20 eV. The triplet state splits into three states with the magnetic quantum numbers $M_1 = (m_2=) \pm 1.0$ which indicate the relative orientation of the total electron spin with respect to the quantisation axis (FIG. 3). Helium may be optically pumped directly using circularly polarised resonant radiation at 1083 nm which has to be tuned to either of one of the $2^3S_1 \rightarrow 2^3P_1$ ($D_4$), $2^4S_1 \rightarrow 2^3P_1$ ($D_1$) or $2^4S_1 \rightarrow 2^3P_2$ ($D_2$) transitions. If the pumping light is circularly polarised (σ'), only transitions with $\Delta m_1 = +1$ are induced. After the atom has spontaneously decayed back into the $2^4S_1$ state it will have the same m (or one that has increased by 1 or 2) with different respective probabilities. After a number of such processes, the atom will end up in the state $m_1 = m_2 = +1$. The direction of atomic polarisation may be easily reversed by changing the helicity of the pumping light. Only pumping of the $D_1$ or $D_2$ transition by circular polarised light line can in principle give a polarisation degree of one, while the $D_0$ transition merely reaches a maximum of one half. Granitza et al., Rev. Sci. Instrum. 66(8) 1995 demonstrated that a spin polarisation degree of 98.5% of triplet $^4$He is possible by pumping the $D_2$ line. However, the $D_0$ line has been shown by Schearer, L. D. et a., Phys. Rev. 42 (1990) to lead to nearly 100% polarisation by the combination of two laser beams of different polarisation and propagation (see FIG. 4). Since the $D_0$ line is well separated from the two others (see FIG. 3) a non-single mode laser may be used to simplify the apparatus.

In FIG. 1 a general schematic diagram of an optical apparatus suitable for directly pumping helium is shown. The light emitted from a diode laser (1) is collimated by a focal length collimation lens (2) to approximately match the dimensions of the helium cell (3). The laser itself may be an SDL-6702-H1 InGaAs diode laser with a 50 mW output in one longitudinal mode or a high power lamp-pumped LNA laser. The helium cell is provided with windows to allow the laser radiation to enter and exit. A quarter-wave plate (4) in front of the cell may be used to produce circularly polarised light from the initially linearly polarised laser beam and careful alignment of the laser is required to select the correct transition. Under certain circumstances it may be desirable to use a filter (5) capable of eliminating some of the fine structure or hyperfine structure components of the resonance radiation. A weak field (eg. $1\times10^{-4}$ Tesla (1 G)) is desirable to define the quantisation axis parallel to the propagation of the pumping light (6).

Alternatively, polarisation of noble gases may be carried out by spin exchange with optically pumped alkali metal vapours. Many combinations of alkali metal and noble gas have been tried successfully eg. polarisation of xenon or helium (I=1/2) by optically pumping one of the $^{87}$Rb, $^2P \rightarrow ^2S_0$, D-lines using for example a high power diode laser OPC-A150-795-RPPS. For $^3$He polarised by rubidium the spin-exchange rate is quite slow and the alkali metal vapour density is maximised whilst minimising the spin relaxation of $^3$He. The alkali metal is conveniently removed from the noble gas in a cold trap. For $^{129}$Xe the spin exchange can be fast, but xenon is very depolarising to rubidium.

Figure 2:
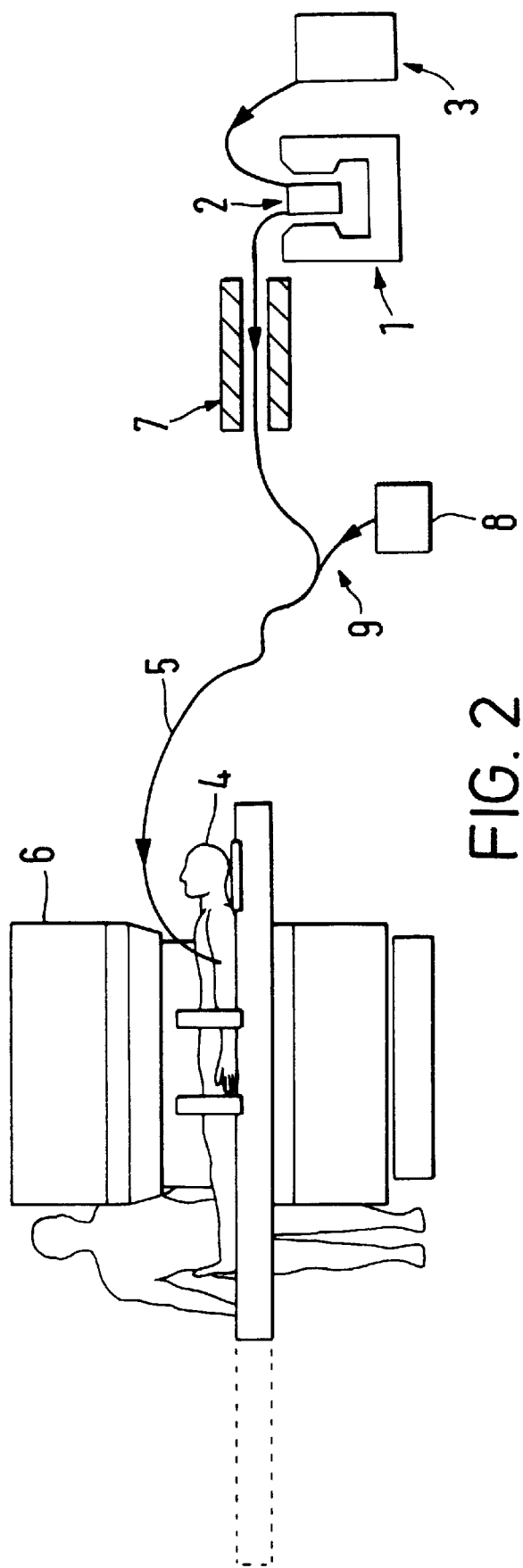
FIG. 2 is a schematic representation of one embodiment of the apparatus according to the invention.

An MR apparatus adapted for use in the method described hereinbefore comprising a device for optically pumping a hyperpolarisable gas provides a further aspect of the present invention. FIG. 2 of the accompanying drawings is a schematic representation of one embodiment of the apparatus according to the invention. The apparatus comprises an optical apparatus (2) as described hereinbefore. A container (3) comprising a pump is provided to introduce a hyperpolarisable gas and/or an MR imaging agent into the optical apparatus. The optical apparatus is surrounded by a free-standing polarising magnet (1) which together with the hyperpolarised gas is capable of providing the nuclear polarisation of the MR imaging magnet. The MR imaging agent is delivered to a subject (4) by a delivery line (5) via a cooling device (7) which serves to condense the MR imaging agent (where the polarisation transfer involves an $^4$He/H$_2$O system, the cooling device may be omitted). Following condensation and cooling of the MR imaging agent (if this is required), water or plasma salts solution may be added from a reservoir (8) via a line (9). The subject is situated within a conventional MR scanner (6).

Preferred hyperpolarisable gases for use in the method according to the invention are those which can be conveniently and rapidly separated from the polarised MR imaging agent. Noble gases are particularly useful given their very low boiling points and inertness. Preferably the chosen gas will exhibit a long hyperpolarisability half-life (preferably at least 1000 s, particularly preferably at least 4000 s and especially preferably 8000 s or more).

A hyperpolarised gas may, if desired, be stored for extended periods of time in a hyperpolarised state. This is achieved by maintaining the gas at very low temperatures, preferably in a frozen state.

For ease of separation of the hyperpolarisable gas and the MR imaging agent, the combination of the two may be advantageously a heterogeneous system, eg. the MR imaging agent is a solid or liquid at ambient temperatures. In all cases, the diffusion distance between the MR imaging agent and gas must be small enough to achieve an effective Overhauser like enhancement so that, although desirable, it is not strictly necessary for the two to be mixed. It is however preferred to use MR imaging agents which are gaseous at the time of polarization transfer.

Thus viewed from a further aspect the present invention provides the use of a hyperpolarised gas in ex vivo nuclear polarisation of an MR imaging agent wherein the whole, substantially the whole, or a portion of said hyperpolarised gas is subsequently separated from said MR imaging agent before the administration of said MR imaging agent to a subject. Preferably said hyperpolarisable gas is a noble gas. Preferably, said MR imaging agent is water.

In one embodiment of the method of the invention where the polarised MR imaging agent is non-solid at ambient temperature and pressure, it may be conveniently stored in frozen form. Given the very low boiling point of noble gases, rapid quenching of a polarised gaseous or liquid MR imaging agent may allow rapid separation from the hyperpolarisable gas and provide the MR imaging agent in frozen form. Generally speaking, at low temperatures the polarisation is retained longer and thus polarised MR imaging agents may be conveniently stored eg. in liquid nitrogen. Prior to administration, the MR imaging agent may be rapidly warmed to physiological temperatures using conventional techniques such as infrared or microwave radiation.

Particularly preferred polarised MR imaging agents are physiologically tolerable aqueous solutions (eg. saline) in which protons are the imaging nuclei of interest. However polarised water itself is especially preferred and has the advantage of being physiologically tolerable and may be administered to the subject free from carriers, excipients or formulation aids. The polarised MR imaging agent may be advantageously an agent with a long $T_1$ relaxation time and/or a long $T_2$ relaxation time. In one embodiment, a long $T_1/T_2$ agent may be added to polarised water to achieve the desired effect by indirect polarisation. Particularly preferably the long $T_1/T_2$ MR imaging agent should be water soluble (eg. a solid with a very high surface area such as a finely divided solid or may be a salt) with a high vapour pressure. It will be apparent that the degree of solubility of the polarised MR imaging agent will determine how rapidly it can be dissolved in administrable media and subsequently administered and, given the finite lifetime of the polarisation, the importance of these factors will be clear.

Viewed from a still further aspect the present invention provides the use of polarised water having an effective nuclear polarisation of 100 T or more, preferably 10 kT or more, especially 30 kT or more as or for the manufacture of an administrable MR imaging agent.

Viewed from a further aspect the invention provides a physiologically tolerable MR imaging agent composition in liquid form comprising an MR imaging agent (eg. water itself) having an effective nuclear polarization of 10 Tesla or more, preferably 20 Tesla or more, especially preferably 100 Tesla or more.

Viewed from a further aspect the present invention provides a composition comprising a hyperpolarised gas, polarised water and optionally an administrable MR imaging agent. Preferably said MR imaging agent is water soluble.

Viewed from a still further aspect the present invention provides a composition comprising a noble gas in liquid form (eg liquid helium) and a solid MR imaging agent or precursor thereof.

Viewed from a yet still further aspect the present invention provides a kit comprising an MR imaging agent, preferably water, and a hyperpolarisable gas together with a means for administering water to a subject in the absence of substantially the whole of said hyperpolarisable gas. In a preferred embodiment, the kit comprises a hyperpolarisable gas, an MR imaging agent and a means for delivering said MR imaging agent in the absence of substantially the whole of said hyperpolarisable gas, eg. by a plunger or pressure applicator.

Given that the method of the invention should be carried out within the time that the MR imaging agent remains significantly polarised, once separation has been achieved it is desirable for administration of the polarised MR imaging agent to be effected rapidly and for the MR measurement to follow shortly thereafter. This means that the sample (eg. body or organ) should be available close to the area in which the polarisation has been carried out. The preferred administration route for the polarised MR imaging agent is parenteral eg. by bolus injection, by intravenous or intraarterial injection or where the lungs are to be imaged by spray, eg. by aerosol spray.

The separation step of the method of the invention is intended to remove substantially the whole of the hyperpolarisable gas from the composition (or at least to reduce it to physiologically tolerable levels) as rapidly as possible. If desired, the gas may be reused which may be an important consideration given the expense of noble gases. Many physical and chemical separation or extraction techniques known in the art may be employed to effect rapid and efficient separation of the hyperpolarisable gas and MR imaging agent. Clearly the more preferred separation techniques are those which can be effected rapidly and particularly those which allow separation in a fraction of the relaxation time $T_1$ eg. less than one second.

The method according to the invention has the benefit of being able to provide significant spatial weighting to a generated image. In effect, the administration of a polarised MR imaging agent to a selected region of a sample (eg. by injection) means that the contrast effect is, in general, localised to that region. This of course depends on the extent of biodistribution over the period in which the MR imaging agent remains significantly polarised. In general, specific body volumes (i.e. regions of interest) may be defined with improved signal to noise properties of the resulting images in these volumes. Where the MR imaging nuclei is other than a proton (eg. $^{13}C$), there will be essentially no interference from background intensity (the natural abundance of $^{13}C$ being negligible) and image contrast will be advantageously high.

In one embodiment, a "native image" of the sample (e.g. body) (ie. one obtained prior to administration of the MR imaging agent or one obtained for the administered MR imaging agent without prior Overhauser enhancement as in a conventional MR experiment) may be generated to provide structural (eg. anatomical) information upon which the image obtained in the method according to the invention may be superimposed. This is a particularly useful aspect of the present method given that the polarisation of the MR imaging agent may only last for a short period and so biodistribution within the timescale of the measurement may be limited. A "native image" is generally not available where $^{13}C$ is the imaging nucleus because of the low abundance of $^{13}C$ in the body. In this case, a proton MR image may be taken to provide the anatomical information upon which the $^{13}C$ image may be superimposed.

The MR imaging agents may be conveniently formulated with conventional pharmaceutical or veterinary carriers or excipients. MR imaging agent formulations manufactured or used according to this invention may contain, besides the MR imaging agent, formulation aids such as are conventional for therapeutic and diagnostic compositions in human or veterinary medicine but will be clean, sterile and free of paramagnetic, superparamagnetic, ferromagnetic or ferrimagnetic contaminants. Thus the formulation may for example include stabilizers, antioxidants, osmolality adjusting agents, solubilizing agents, emulsifiers, viscosity enhancers, buffers, etc. Preferably none of such formulation aids will be paramagnetic, superparamagnetic, ferromagnetic or ferrimagnetic. The formulation may be in forms suitable for parenteral (eg. intravenous or intraarterial) or enteral (eg. oral or rectal) application, for example for application directly into body cavities having external voidance ducts (such as the lungs, the gastrointestinal tract, the bladder and the uterus), or for injection or infusion into the cardiovascular system. However solutions, suspensions and dispersions in physiological tolerable carriers eg. water will generally be preferred.

For use in in vivo imaging, the formulation, which preferably will be substantially isotonic, may conveniently be administered at a concentration sufficient to yield a 1 micromolar to 10 mM concentration of the MR imaging agent (or even higher where the MR imaging agent is water) agent is in the imaging zone; however the precise concentration and dosage will of course depend upon a range of factors such as toxicity, the organ targeting ability of the MR imaging agent, and the administration route. The optimum concentration for the MR imaging agent represents a balance between various factors. In general, optimum concentrations would in most cases lie in the range 0.1 to 100 mM (or even higher where the MR imaging agent is water), especially 0.2 to 10 mM, more especially 0.5 to 5 mM. Formulations for intravenous or intraarterial administration would preferably contain the MR imaging agent in concentrations of 10 to 1000 mM (or even higher where the MR imaging agent is water), especially 50 to 500 mM. For bolus injection the concentration may conveniently be 0.1 mM to 56M, preferably 0.2 mM to 10M, more preferably 0.5 mM to 1M, still more preferably 1.0 mM to 100 mM, yet still more preferably 5 to 25 mM, especially preferably 6 to 15 mM.

Parenterally administrable forms should of course be sterile and preferably free from physiologically unacceptable agents and from paramagnetic, superparamagnetic, ferromagnetic or ferrimagnetic contaminants, and should have low osmolality to minimize irritation or other adverse effects upon administration and thus the formulation should preferably be isotonic or slightly hypertonic. Suitable vehicles include aqueous vehicles customarily used for administering parenteral solutions such as Sodium Chloride solution, Ringer's solution, Dextrose solution, Dextrose and Sodium Chloride solution, Lactated Ringer's solution and other solutions such as are described in Remington's Pharmaceutical Sciences, 15th ed., Easton: Mack Publishing Co., pp. 1405–1412 and 1461–1487 (1975) and The National Formulary XIV, 14th ed. Washington: American Pharmaceutical Association (1975). Since saturated salt solutions at temperatures just above their freezing points may be used to cool an MR imaging agent (such as water) down from the temperature at which polarization occurs, such saturated solutions also form an aspect of the present invention. The compositions can contain preservatives, antimicrobial agents, buffers and antioxidants conventionally used for parenteral solutions, excipients and other additives which are compatible with the MR imaging agents and which will not interfere with the manufacture, storage or use of the products.

Where the MR imaging agent is to be injected, it may be convenient to inject simultaneously at a series of administration sites such that a greater proportion of the vascular tree may be visualized before the polarization is lost through relaxation. Intraarterial injection is useful for preparing angiograms and intravenous injection for imaging larger arteries and the vascular tree.

The dosages of the MR imaging agent used according to the method of the present invention will vary according to the precise nature of the MR imaging agents used, of the tissue or organ of interest and of the measuring apparatus. Preferably the dosage should be kept as low as possible while still achieving a detectable contrast effect.

Once the MR imaging agent has been administered to the subject, the procedure for detecting MR signals is that which is well known from conventional MR scanning. It is advantageous to use fast imaging sequences eg. EPI, RARE or FSE. A preferred imaging sequence is echo planar imaging (EPI) which is movement sensitive or RARE or a spiral scan.

The present method provides a versatile diagnostic tool. Where an MR imaging agent such as water has been injected into the groin, images may be obtained 4–5 s post-injection. The dilution of the water (especially in the lungs) will reduce the effective duration of the polarisation to $\leq 60$ s. It is possible to image the heart vasculature (coronary arteries) or the brain and diagnose heart complaints (eg. clotting or muscle defects), brain tumours or disruption of the blood/brain barrier. Thus the present invention provides the use of water as a perfusion agent.

The following Examples are intended to illustrate the invention in a non-limiting manner.

EXAMPLE 1

An experiment was carried out to compare the expected SNR in (1) He-images generated using helium at 1 atm in lung tissue, (2) $^{13}$C-images generated using hyperpolarised $H_2$ and (3) "standard" contrast enhanced proton images. All calculations were performed using MRI-simulation software developed at Nycomed Innovation in Malmö Sweden. The calculation procedure is based on the k-space formalism (Petersson et al., 1993, Mag. Res. Imaging, 11: 557–568) and the multi dimensional description (Petersson et al., 1997, Mag. Res. Imagin, 15: 451–467) of the image formation in MRI.

Figure 5:
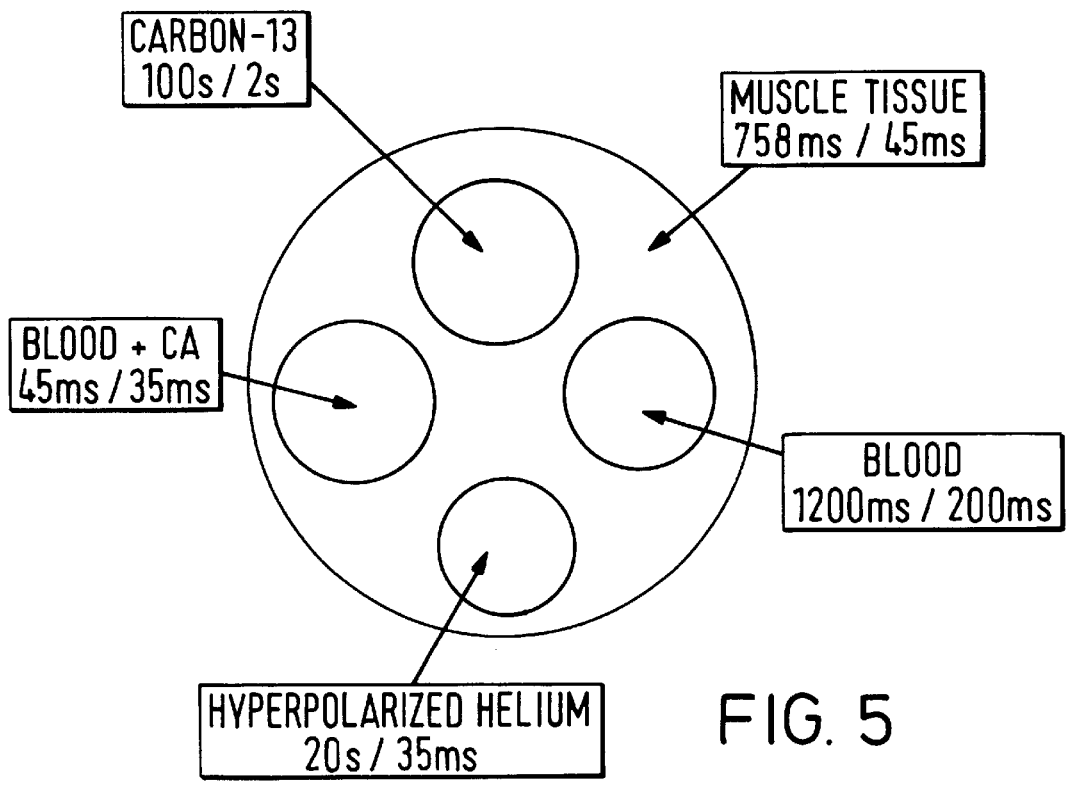
FIG. 5 shows the magnetically defined phantom used to input all calculations.

A mathematically defined phantom according to FIG. 5 was used to input all calculations. The $^{13}$C was assumed to be in a bolus and the magnitude of the magnetization was raised to five times the magnitude used for hydrogen. 50% polarisation was assumed and the concentration was 45.0 mM. The relaxation times for $^{13}$C were $T_1=100$ s and $T_2=2$ s. The proton relaxation times are those found at 1.5 T. The blood containing contrast agent uses the relaxation times found when the bolus tracking technique is utilized. Hyperpolarised helium was assumed to be in form of a gas at 1 atm and the relaxation times were chosen in accordance with Bachert et al. Magn. Res. in Medicine, 36: 192–196 (1996) when the gas is present inside the lungs.

The short T2 (T2*) is due to the high diffusion coefficient ($D \approx 2$ cm$^2$ s$^{-1}$). The magnitude of the helium magnetization was raised to 16 times that used for hydrogen. 50% polarisation was assumed and the concentration was 45.0 mM.

Two different pulse sequences were used. A fast gradient echo sequence, FLASH, was used to generate the hydrogen image and the helium image. The hydrogen pulse sequence parameters were TR/TE/$\alpha$=8 ms/2 ms/30° and the helium pulse sequence was 8 ms/2 ms/3°. The enhancement gain of the He-magnetization is in this way divided during the imaging process.

A RARE (Fast Spin Echo) sequence was used to generate the $^{13}$C image. Eight interleaves were used in order to simulate the situation found when imaging the heart using gating. The $^{13}$C magnetization behaved the same way as the He magnetization i.e. no new magnetization was generated due to T1-relaxation during the imaging process. During the calculation the $^{13}$C were modelled in the form of a bolus and between the interleave in the pulse sequence the excited magnetization was replaced with fresh magnetization. If a static object was imaged the sequence could have been performed as a single shot sequence without (due to the long T2 value) any loss in signal amplitude.

Results

Hydrogen

Figure 6:
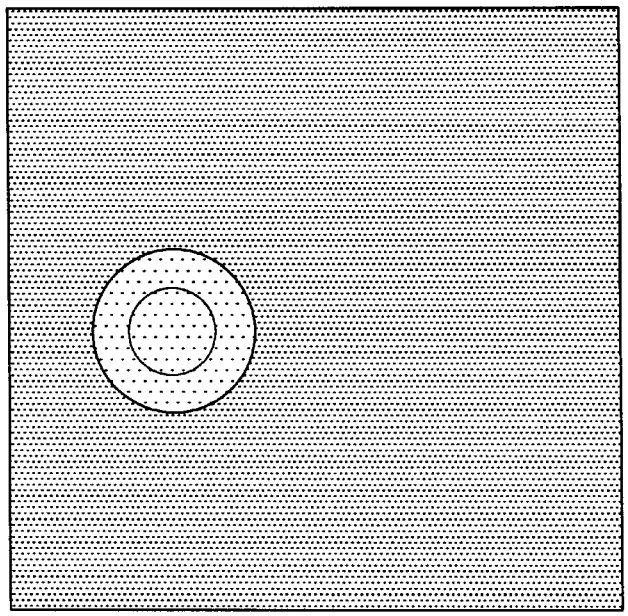
FIG. 6 is a proton image.

In the proton image (FIG. 6), the helium and the $^{13}$C do not show up. The signal from the blood and contrast agent appears bright. The short TR and the relatively high flip angle makes the image strongly T1-weighted. The muscle and the blood without contrast agent appears dark. The signal amplitude in the ROI was 129 and SNR=107.

Helium

Figure 7:
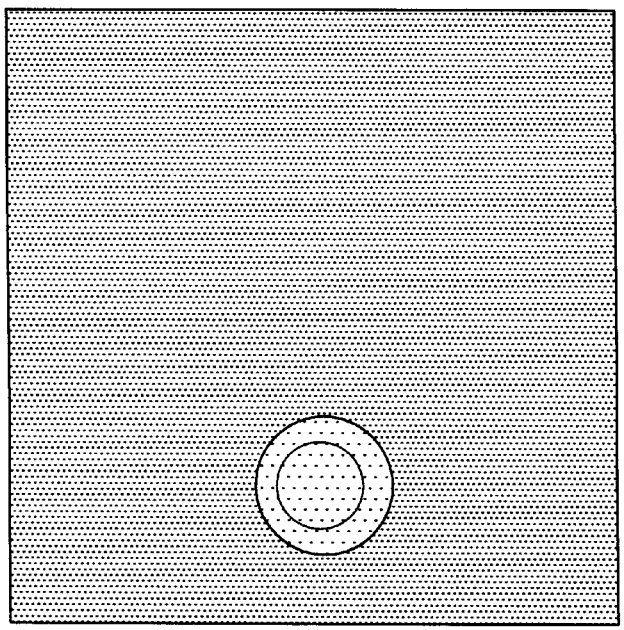
FIG. 7 is a helium image.

In the He-image (FIG. 7) the proton and $^{13}$C do not show up. The signal from the helium appears bright and no background from other tissues are present. The short TR and the relatively low flip angle generated an image which in normal proton imaging would be considered as a spin density image. The signal amplitude in the ROI was 347 and SNR=289.

Carbon-13

Figure 8:
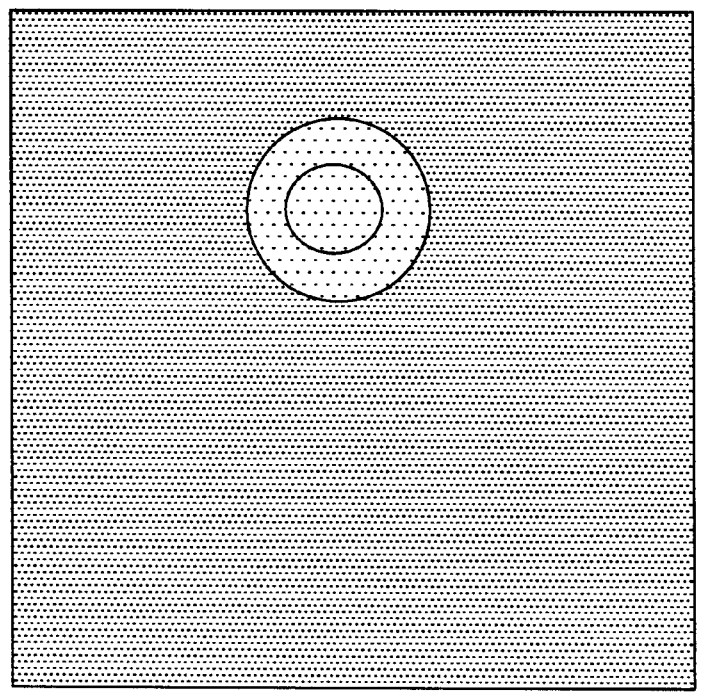
FIG. 8 is a carbon $^{13}$C-image.

In the $^{13}$C-image (FIG. 8) the protons and the helium do not show up. The signal from $^{13}$C appears bright and no background from other tissues is present. The selected RARE sequence may be considered T2-weighted. The image was generated using a multi shot technique but a single shot version would (due to the long T2-value) result in the same signal amplitude. The signal amplitude in the ROI was 2605 and SNR=1737.

Conclusion

The generated signal amplitude and SNR values indicate the already recognised utility of helium as a contrast agent in lung imaging. If the gas was dissolved in blood the signal amplitude would drop considerably (Martin et al., J. Mag. Res. Imaging, 1997, 7, 848–851). The $^{13}$C image indicated that when the polarisation of enriched hydrogen is transferred to a $^{13}$C-atom in a suitable organic molecule images with high SNR may be generated. Due to the long T1 and T2, modern fast single shot sequences may be used. Whilst the $^{13}$C-fluid behaves as a bolus the long T1 will make it possible to reach the heart with only a moderate loss in signal amplitude even if it is administered by i.v. injection.

EXAMPLE 2

An experiment is carried out to demonstrate the significant enhancement of the $^{13}$C signal of a contrast agent in solution by transferring the polarisation from a hyperpolarised gas.

0.1 ml of a 1M $K_2{}^{13}CO_3$ solution in $H_2O$ at pH12 is frozen in the bottom of a pressure NMR test tube. Oxygen is removed from the sample and the tubes by several freeze-pump-thaw cycles. The NMR tube is kept in a liquid nitrogen dewar. 0.1 ml of solid, hyperpolarised $^{129}$Xe is frozen on top of the frozen carbonate solution. The test tube is sealed and heated for the two phases to mix as a liquid. A $^{13}$C NMR spectrum is recorded and normalised with a thermal equilibrium signal.

The experiment demonstrates the significant enhancement of a $^{13}$C labelled contrast agent in solution suitable for injection and MR imaging.

EXAMPLE 3

An experiment is carried out to demonstrate the advantageous transfer of polarisation to a solid contrast agent. After the polarisation step the solid contrast agent is dissolved in water and a significant enhancement of the signal is measured.

0.1 g of $K_2{}^{13}CO_3$ as a fine powder is placed in a container. 0.1 ml of hyperpolarised $^{129}$Xe is frozen on the carbonate particles (adsorbed). The temperature is slowly increased and the $^{129}$Xe brought into the liquid state and held there for a short period. After the cross polarisation step, 1 ml of water is added and the solution is transferred to a NMR test tube. $^{13}$C NMR spectrum is recorded immediately and the carbonate signal is normalised with the thermal equilibrium signal.

The experiment demonstrates the significant enhancement of a $^{13}$C labelled contrast agent as a solid and the dissolution of the contrast agent in a formulation suitable for injection and further imaging.

We claim:

1. A method of magnetic resonance imaging of a sample said method comprising:

(i) hyperpolarising a hyperpolarisable gas before, during or after introducing an MR imaging agent thereto whereby to cause nuclear polarization of said MR imaging agent, and wherein said hyperpolarisable gas is a noble gas and said MR imaging agent is a different chemical species to said hyperpolarisable gas;

(ii) optionally (simultaneously or sequentially to step (i)) exposing the MR imaging agent to a uniform magnetic field;

(iii) separating the whole, substantially the whole, or a portion of said hyperpolarisable gas from said MR imaging agent;

(iv) administering said MR imaging agent to said sample;

(v) exposing said sample to radiation of a frequency selected to excite nuclear spin transitions in the MR imaging nuclei in said MR imaging agent;

(vi) detecting magnetic resonance signals from said MR imaging agent in said sample; and (vii) optionally, generating an image or biological functional data or dynamic flow data from said detected signals.

2. A method as claimed in claim 1 wherein step (ii) is non-optional.

3. A method as claimed in claim 1 wherein said MR imaging agent is gaseous during the polarization step (i).

4. A method as claimed in claim 1 wherein said hyperpolarisable gas is in liquid or solid form during the polarization step (i).

5. A method as claimed in claim 1 wherein said hyperpolarisable gas is in gaseous form during the polarization step (i).

6. A method as claimed in claim 1 wherein said hyperpolarisable gas is $^3$He or $^{129}$Xe.

7. A method as claimed in claim 1 wherein said MR imaging agent is water soluble.

8. A method as claimed in claim 1 wherein said MR imaging agent is water.

9. A method as claimed in claim 8 wherein said MR imaging agent is in the form of water vapour during the polarization step (i).

10. A method as claimed in claim 9 wherein polarised water vapour is subjected to rapid cooling.

11. A method as claimed in claim 10 wherein said polarised water vapour is subjected to rapid cooling by the addition of cold saturated salt solution.

12. A method as claimed in claim 1 wherein said MR imaging agent contains one or more of the nuclei selected from the group consisting of $^{19}$F, $^{13}$C, $^{31}$P and sodium.

* * * * *